United States Patent [19]

Beutler

[11] Patent Number: 4,890,199
[45] Date of Patent: Dec. 26, 1989

[54] MINIATURE SHIELD WITH OPPOSING CANTILEVER SPRING FINGERS

[75] Inventor: Scott D. Beutler, Hoffman Estates, Ill.

[73] Assignee: Motorola, Inc., Schaumburg, Ill.

[21] Appl. No.: 267,419

[22] Filed: Nov. 4, 1988

[51] Int. Cl.[4] .............................................. H05K 9/00
[52] U.S. Cl. .................. 361/424; 174/35 R; 439/607; 455/300; 361/395
[58] Field of Search .................. 439/607; 267/160; 174/35 R, 35 MS; 455/300, 301, 344, 347, 349; 334/85; 361/212, 220, 386, 388, 391, 395, 399, 417, 419, 420, 422, 424, 427

[56] References Cited

U.S. PATENT DOCUMENTS

| | | |
|---|---|---|
| 3,712,604 | 1/1973 | Nation . |
| 4,038,505 | 7/1977 | Gasparaitis et al. . |
| 4,278,957 | 7/1981 | Starai et al. . |
| 4,494,095 | 1/1985 | Noji ...................................... 361/424 |
| 4,533,188 | 8/1985 | Miniet . |
| 4,586,764 | 5/1986 | Mullen, III et al. . |
| 4,626,963 | 12/1986 | Speer ................................. 174/35 R |
| 4,662,691 | 5/1987 | Derdzinski . |
| 4,680,676 | 7/1987 | Petratos et al. . |
| 4,717,990 | 1/1988 | Tugcu . |
| 4,718,110 | 1/1988 | Schaefer ............................... 455/347 |

Primary Examiner—Gerald P. Tolin
Attorney, Agent, or Firm—Raymond A. Jenski; Rolland R. Hackbart

[57] ABSTRACT

A miniature shield with opposing cantilever spring fingers is disclosed. Shield walls, which may be part of a housing for electronic equipment, are designed to insert between a plurality of opposing cantilever spring fingers arranged in a "U"-shaped channel. Torque generated at the bottom of the "U"-shaped channel is minimized by the opposing cantilever spring fingers and enables the channel to be reflow soldered to an electronic circuit board.

6 Claims, 2 Drawing Sheets

MINIATURE SHIELD WITH OPPOSING CANTILEVER SPRING FINGERS

BACKGROUND OF THE INVENTION

This invention relates generally to apparatus which provides easily removable electromagnetic shielding and more particularly to such shielding employing opposing cantilever spring fingers specially adapted to miniature electronic equipment such as portable radiotelephones.

Radios, computers, and other electronic equipment often generate electromagnetic signals in one portion of the electronic equipment which may radiate to and interfere with another portion of the electronic equipment. To minimize this interference effect, electrically conducting (and sometimes magnetically conducting) material is interposed between the two portions of the electronic circuitry. This shielding may take the form of a wall or a complete enclosure and may be placed around the portion of the electronic circuit generating the electromagnetic signal and/or may be placed around the portion of the electronic circuit which is susceptible to the electromagnetic signal.

Classically, a sheet of copper may be formed in a configuration which may be soldered to the electronic circuit in a position where it will perform a shielding function. Such a permanent attachment usually requires space in the electronic circuit for secure attachment and is difficult to remove if the need for service arises. It is also common to use an entire housing which is cast or molded to enclose the electronic circuit to provide the desired shielding. This solution is often used when large areas needing shielding are involved but requires a significant amount of space. The use of spring fingers as part of the shielding technique has been employed in devices having removable shields but such fingers, because they do not oppose each other, place a mechanical bias on the fingers which must be compensated either by the mass of the shielding or by some other elements in the shielding. Cantilevered opposing spring contacts of connectors have been used in some connectors but only independently on each individual pin. The difficulty of providing connection over a relatively large area, such as a shield surface, has not been addressed.

Thus, miniaturized electronic devices place even greater constraints on shielding, first, because the electronic circuits are closer together, and second, the physical room available for shielding is greatly reduced. The techniques for attaching or surrounding the electronic circuit to the shielding must consume as little space as possible while providing secure, easily manufactured, and easily repairable interconnections.

SUMMARY OF THE INVENTION

It is, therefore, one object of the present invention to provide electromagnetic signal shielding in an electronic device for which such shielding uses as little space as possible.

It is another object of the present invention to provide such shielding in a way that enables the shielding to be easily removed.

It is a further object of the present invention to enable the electromagnetic shielding to be assembled using automatic manufacturing processes.

Accordingly, these and other objects are realized in the present invention which encompasses a double cantilever spring channel and a formed conducting member disposed between each cantilever spring such that all forces created by the springs are cancelled and forces normal to the point of attachment of the double cantilever spring are prevented.

DESCRIPTION OF THE PREFERRED EMBODIMENT

Figure 1:
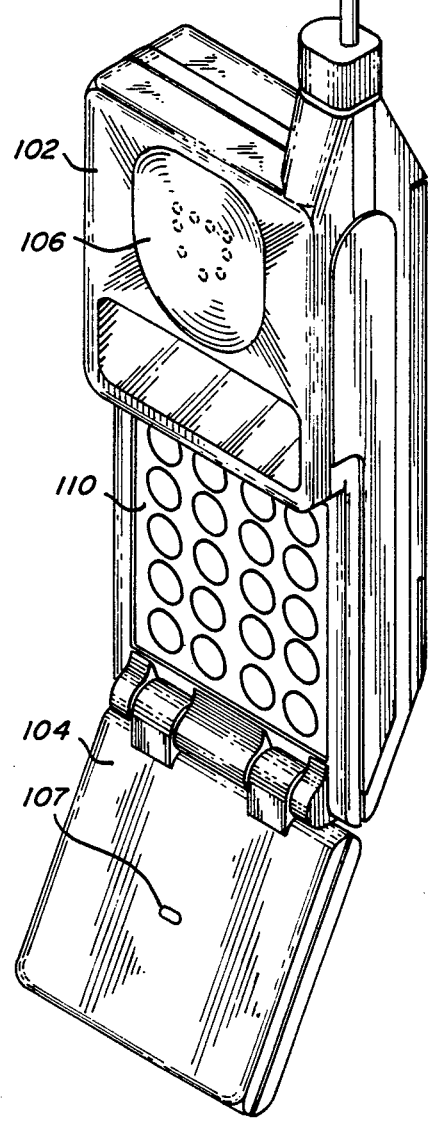
FIG. 1 is an isometric drawing of a handheld portable radiotelephone which may employ the present invention.

A portable radiotelephone adapted to be used in a cellular radiotelephone system is shown in FIG. 1. The present invention may be employed in such a portable radiotelephone as well as other miniature electronic equipment. The illustrated portable unit consists of two external portions, a body portion 102 and a flip element portion 104. The drawing of FIG. 1 shows the flip element 104 in an "open" position such that a user of the portable unit may listen via earpiece 106 and may speak into a microphone 107. A dial or keypad 110 consists of a plurality of buttons numbered one through zero, #, and *, in a familiar telephone arrangement. The keypad 110 also has additional function buttons such as "send", "end", "on-off", and other buttons associated with telephone number recall.

Figure 2:
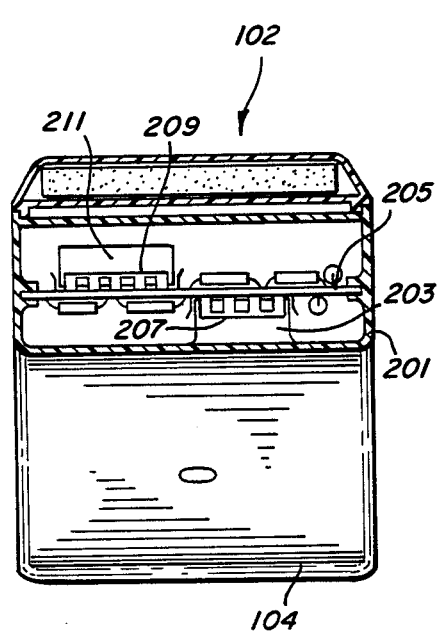
FIG. 2 is a section through the hand held portable radiotelephone of FIG. 1 showing the placement of a circuit board and the shielding of the present invention.

A section through the body portion 102 reveals the internal construction as shown in FIG. 2. The housing 201 of the body portion 102 may be constructed of a conventional plastic material such as polycarbonate. Portions, or all, of the inside surface of housing 201 may be plated with a conductive material such as an aluminum and nichrome thin film, or painted with a conductive paint. The interior surface plating of housing 201 enables the use of raised wall areas or ribs 203 on the inside surface of housing 201 for shielding purposes.

In the preferred embodiment, a conventional double-sided circuit board 205 is placed within housing 201. Located on the circuit board 205 are conventional electronic components arranged in high density configuration to perform the desired electronic function of the unit. Also placed on circuit board 205 are "U"-shaped double cantilever spring channels 207 and 209 which are soldered to, and in electrical contact with, the ground (or other circuit) of the circuit board 205. Additionally, spring channels 207 and 209 are in removable electrical contact with the raised shield area 203 of housing 201 and an independent shield 211 formed of a conductive sheet material such as copper. Thus, an important aspect of the present invention, that of easily removable shielding in a dense area is visible in the section of FIG. 2.

Figure 3:
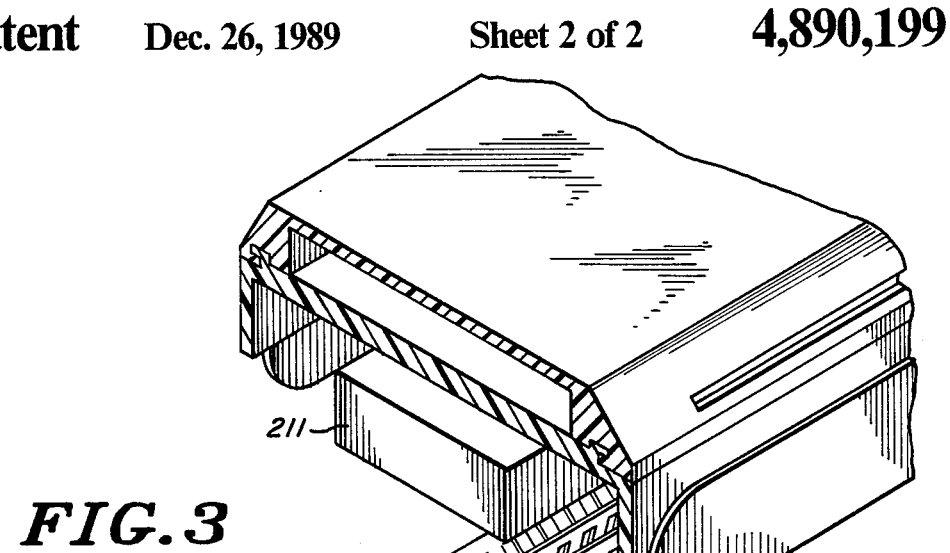
FIG. 3 is an isometric sectional view of the portable radiotelephone of FIG. 1 exploded to show a circuit board employing the shielding of the present invention.

An exploded view of the circuit board 205 in the plastic housing 201 is shown in FIG. 3. It can be seen that the spring channel 209 consists of a plurality of opposing double cantilever spring fingers, for example opposing spring fingers 301 and opposing spring fingers 303. The conducting shield 211 is arranged such that one side of the double cantilever spring fingers of 301 and 303 rest on the inside portion of shield 211 and the opposing spring finger rests on the outside of shield 211 when the shield 211 is properly placed. Likewise, the raised plated portion 203 of housing 201 is inserted between each of the opposing cantilever spring fingers of channel 207 (not shown) to effect ground connection between the circuit board 205 and the raised shield portion 203 of housing 201.

Figure 4:
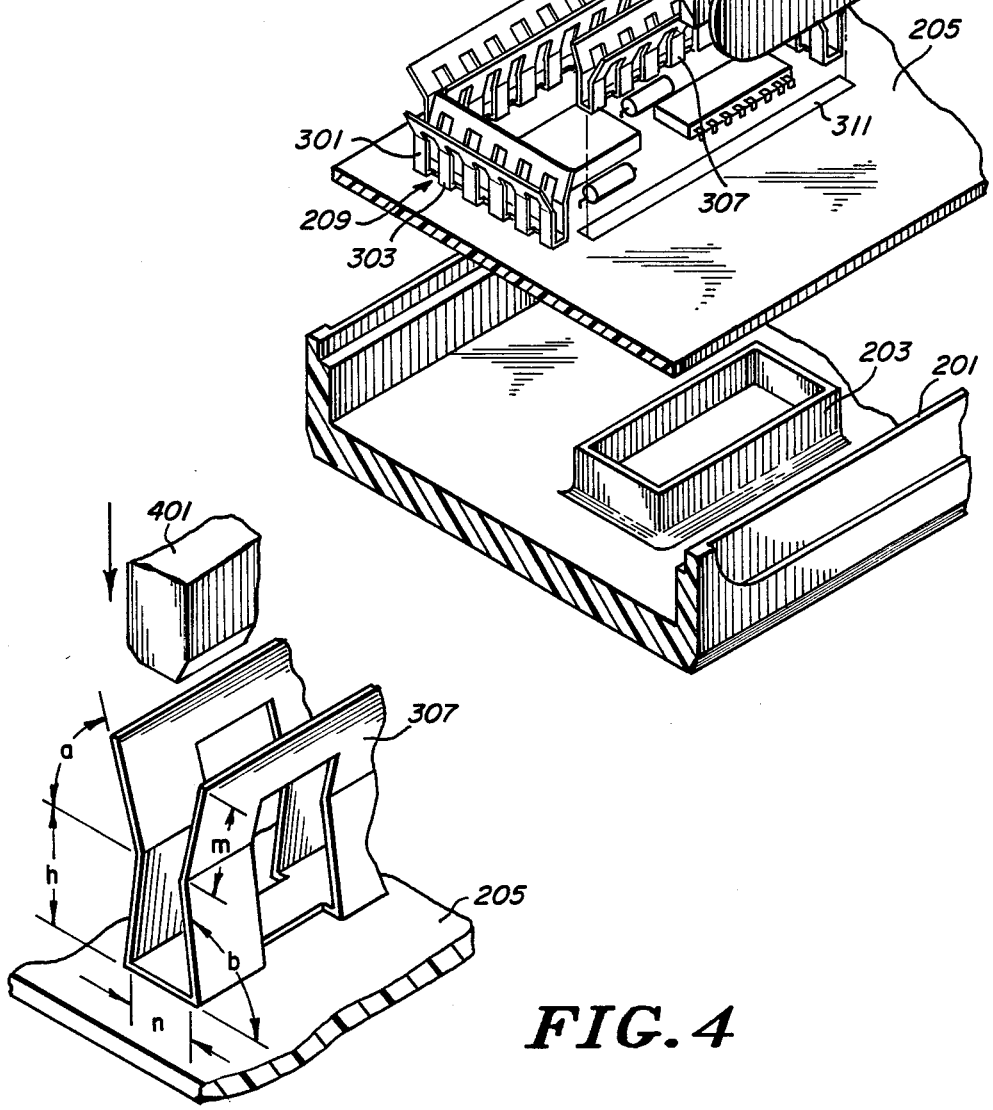
FIG. 4 is a drawing of the double cantilever spring channel of the present invention.

The details of "U"-shaped spring channel are visible in FIG. 4. In the preferred embodiment, this double cantilever spring channel is a single part constructed from 0.013 cm thick beryllium copper which is nickel and gold plated. The double cantilever spring channel is formed having an elongated planar base portion with width "n"=1.12 mm suitable for mounting on a flat substrate such as a circuit board. Each of the opposing cantilever spring fingers extends away from the base at an angle "b" of 94° measured from the plane of the base to the outside surface of the "U"-shaped channel to a height "h"=2.00 mm above the bottom surface of the base. At height "h" each spring finger angles away from its opposing spring finger at an angle "a" measured relative to the plane of the base to the outside surface of the "U"-shaped channel. Angle "a" equals 72° in the preferred embodiment. This end of each spring finger extends 1.45 mm ("m"=1.45 mm) above the height "h" and forms an easy entry path for the shield into the "U"-shaped channel.

Returning to FIG. 3 there is illustrated a preferred mounting method for the "U"-shaped channel on a circuit board 205. A portion of the "U"-shaped channel 307 is secured to the circuit board 205 by a standard solder reflow process in which solder or solder paste is applied to an area 311 of circuit board 205 prior to the placement of spring channel 307. Spring channel 307 may then be placed in area 311 by automatic or robotic techniques such as that used for other more standard circuit components. Alternatively, each spring channel may be loaded onto a removable carrier and then placed as a group onto the circuit board. Such "pick-and-place" techniques allow for the automatic placement of spring channel 307 and other circuit components in very small areas and with a precision not generally achievable through manual processes. Once the spring channel 307 and the other components are placed on the circuit board 205, circuit board 205 and its load of components may be reflow soldered by conventional reheating techniques to securely and electrically affix the components to the circuit board. This aspect of the present invention: automatic placement of the spring channel 307 and its reflow soldering, enable a electromagnetic shield to be installed in a very small area.

Attachment of the "U"-shaped channel 307 by solder alone could result in insufficient mechanical strength at the point of soldering. The double cantilever spring design of the "U"-shaped channel, as shown in FIG. 4, results in a cancellation of forces from each side of the shield wall 401, thereby resulting in essentially no torque about the point of attachment nor forces normal to the circuit board 205 due to the insertion of shield wall 401. Shield wall 401, in the preferred embodiment, utilizes chamfered edges to facilitate insertion into the spring fingers of 307.

In summary, then, shielding apparatus for miniature electronic equipment has been shown and described. This shielding apparatus uses a "U"-shaped double cantilever spring channel with a plurality of opposing fingers to enable easy insertion and withdrawal of shield wall members. Since the opposing spring fingers cancel the forces generated by contact with the shield wall members, torque generated at the bottom of the "U"-shaped channel (which is mounted to an electronic circuit substrate) is essentially cancelled. The shield walls may be molded into the electronic equipment housing for further reduction of shielding size. While a particular embodiment of the invention has been shown and described, it is to be understood that the invention is not to be taken as limited to the specific embodiment herein and that changes and modifications may be made without departing from the true spirit of the invention. It is therefore contemplated to cover the present invention, and any all such changes and modifications, by the appended claims.

I claim:

1. An electromagnetic shield apparatus for miniature electronic circuitry on a substrate which is at least partially surrounded by a housing, comprising:
   an essentially "U"-shaped conductive channel further comprising:
     a plurality of pairs of opposing cantilever spring fingers attached to an elongated planar common base,
     a first spring finger of said plurality of pairs of opposing cantilever spring fingers extending away from the plane of said base at a first obtuse angle and an opposing second spring finger of said plurality of pairs of opposing cantilever spring fingers extending away from the plane of said base at a second obtuse angle, such that said first and said opposing second spring fingers approach each other,
     each said first and said opposing second of said pair of spring fingers further having an end portion extending in a direction away from said opposing second and said first spring finger respectively;
   a conductive area on the substrate connected to the electronic circuitry and to which said "U"-shaped conductive channel is electrically coupled; and
   a shield portion comprising a raised conductive segment of the housing which is disposed at least between said first and opposing second spring fingers.

2. An electromagnetic shield apparatus in accordance with claim 1 wherein said first and said opposing second spring fingers extend in a direction away from each other at an acute angle relative to said plane of said base.

3. An electromagnetic shield apparatus in accordance with claim 1 wherein said conductive area further comprises a reflow solder surface.

4. A portable radiotelephone having a housing with a conductive material covering at least a portion of the inside surface of the housing and having electronic circuitry substantially enclosed in the housing, comprising:
   a substrate with the circuitry thereon disposed within the housing:
   an essentially "U"-shaped conductive channel further comprising:
     a plurality of pairs of opposing cantilever spring fingers attached to an elongated planar common base,
     a first spring finger of said plurality of pairs of opposing cantilever spring fingers extending away from the plane of said base at a first obtuse angle and an opposing second spring finger of said plurality of pairs of opposing cantilever spring fingers extending away from the plane of said base at a second obtuse angle, such that said first and said opposing second spring fingers approach each other, each said first and said opposing second of said pairs of spring fingers further having an end portion extending in a direction away from said opposing second and said first spring finger respectively;

a raised conductive wall portion disposed on the inside surface of the housing and further disposed between each said first and said opposing second of said pairs of spring fingers; and a conductive area disposed on said substrate essentially opposite said raised conductive wall and to which said "U"-shaped conductive channel is electrically connected.

5. A portable radiotelephone in accordance with claim 4 wherein each said first and said opposing second of said pairs of spring fingers extend in a direction away from each other at an acute angle relative to said plane of said base.

6. A portable radiotelephone in accordance with claim 4 wherein said "U"-shaped conductive channel is reflow soldered to said conductive area.

* * * * *